United States Patent [19]
Ema

[11] Patent Number: 5,696,013
[45] Date of Patent: Dec. 9, 1997

[54] METHOD OF MANUFACTURING SEMICONDUCTOR DEVICE HAVING UNIT CIRCUIT-BLOCKS

[75] Inventor: Taiji Ema, Kawasaki, Japan

[73] Assignee: Fujitsu Limited, Kawasaki, Japan

[21] Appl. No.: 463,928

[22] Filed: Jun. 5, 1995

Related U.S. Application Data

[62] Division of Ser. No. 264,764, Jun. 23, 1994, Pat. No. 5,539,224, which is a continuation of Ser. No. 851,100, Mar. 12, 1992, abandoned.

[30] Foreign Application Priority Data

Mar. 18, 1991 [JP] Japan ........................... 3-51817

[51] Int. Cl.$^6$ ........................ H01L 21/308; H01L 21/77
[52] U.S. Cl. ................. 437/51; 437/228; 156/659.11; 430/313
[58] Field of Search .................. 437/51, 228 M, 437/229; 156/659.11; 430/311, 313

[56] References Cited

U.S. PATENT DOCUMENTS

| | | | |
|---|---|---|---|
| 4,426,584 | 1/1984 | Bohlen et al. | 430/296 |
| 4,500,906 | 2/1985 | Ohno et al. | 357/207 |
| 4,583,111 | 4/1986 | Early | 357/207 |
| 4,694,320 | 9/1987 | Asano. | 357/207 |
| 4,696,889 | 9/1987 | Yevick | 430/311 |
| 4,701,778 | 10/1987 | Aneha et al. | 357/45 |
| 4,774,559 | 9/1988 | Culican et al. | 357/211 |
| 4,858,175 | 8/1989 | Sato | 364/900 |
| 4,869,998 | 9/1989 | Eccles et al. | 437/229 |
| 4,907,062 | 3/1990 | Fukushima | 357/72 |
| 4,985,374 | 1/1991 | Tsuji et al. | 148/DIG. 137 |
| 5,095,352 | 3/1992 | Noda et al. | 357/211 |
| 5,100,508 | 3/1992 | Yoshida et al. | 156/659.11 |
| 5,111,271 | 5/1992 | Hatada et al. | 357/207 |
| 5,132,571 | 7/1992 | McCollum et al. | 357/207 |
| 5,160,997 | 11/1992 | Sandoh et al. | 357/207 |
| 5,175,128 | 12/1992 | Ema et al. | 437/228 M |
| 5,302,491 | 4/1994 | Akylas et al. | 437/229 |
| 5,364,718 | 11/1994 | Oae et al. | 430/311 |

FOREIGN PATENT DOCUMENTS

| | | | |
|---|---|---|---|
| 0 013 088 | 7/1980 | European Pat. Off. . | |
| 0 283 655 | 9/1988 | European Pat. Off. . | |
| 328410 | 8/1989 | European Pat. Off. . | |
| 0 347 853 | 12/1989 | European Pat. Off. . | |
| 62-14428 | 1/1987 | Japan | 430/311 |
| 62-092439 | 4/1987 | Japan . | |
| 62-291182 | 12/1987 | Japan . | |
| 63-298347 | 12/1988 | Japan . | |
| 1-073616 | 3/1989 | Japan . | |

OTHER PUBLICATIONS

S. Wolf, "Silicon Processing for the VLSI Era", vol. II, 1990, pp. 432–33, 546–61, Jun. 5, 1990.

J.B. Brinton, Electronics, Nov. 30, 1981, pp. 40–41, "E-beam, UV lithography join in single resist step for precision, speed" Nov. 30, 1981.

Dhawan, S., "Introduction to Semi-Custom Integrated Circuits," *IEEE Transactions On Nuclear Science*, vol. 33, No. 1, Feb. 1986, New York, NY, pp. 853–861.

*Primary Examiner*—Trung Dang
*Assistant Examiner*—Leon Radomsky
*Attorney, Agent, or Firm*—Staas & Halsey

[57] ABSTRACT

A semiconductor device having two or more unit circuit-blocks is produced by (a) forming in a chip area on a substrate two or more circuit-blocks by repeating, a required number of times, a process comprising exposing in sequence each block section within each chip area coated with a resist film, using masks for making respective circuit-blocks, developing a resist pattern, and a subsequent process using the pattern, and (b) forming external interconnections between the circuit-blocks using a resist pattern formed over the circuit-blocks.

13 Claims, 6 Drawing Sheets

METHOD OF MANUFACTURING SEMICONDUCTOR DEVICE HAVING UNIT CIRCUIT-BLOCKS

This application is a division of application Ser. No. 08/264,764, filed Jun. 23, 1994, U.S. Pat No. 5,539,224 which is a continuation of application Ser. No. 07/851,100, filed Mar. 13, 1992, now abandoned.

BACKGROUND OF THE INVENTION

1. Field of the Invention

The invention relates to a multifunctional highly integrated, high capacity semiconductor device having unit circuit-blocks with respective separate functions, and connecting circuits for the conjunction (i.e., interconnection) of the circuit-blocks.

Remarkable advances in the field of semiconductor devices have been accomplished by the development of fine-forming techniques, whereby the area of use of the semiconductor devices has been rapidly enlarged, and a proportion occupied by custom integrated circuits, called application specific integrated circuits (ASICs), has increased more and more.

In the case of ASICs, in addition to the performance thereof, a shortening of the time for delivery of products to a customer is very important. The invention provides a method of achieving a reduction of the time needed for the delivery of ASICs.

2. Description of the Related Art

Prior art ASICs are manufactured by one of the following methods: 1) a gate array method in which bulk elements such as transistors are pre-formed, and an interconnection thereof is then made to satisfy the user's requirements; 2) a standard cell method in which basic circuit elements are previously proposed to a user, a bulk design of a chip is made, based on the user's requirements, and the production thereof is then started; and 3) a full custom method in which the design of a chip is based, from the beginning, on the user's specification.

Each of these methods has advantages and disadvantages. For example, the gate array method provides a short delivery time, but is wasteful of unused elements, as all elements are not used when meeting a user's requirements; the full custom method eliminates this waste of elements, but requires a long delivery time, as it is necessary to design the whole chip, so as to be manufactured as demanded by the customer.

Under the above-mentioned situation, the standard cell method is expected to dominate the ASIC manufacturing art, as it provides a balance of a delivery time and wastage of unnecessary elements.

Nevertheless, even in the standard cell method, it is important to further reduce the time needed for delivery of products to a customer, because under present conditions, products are made by following a sequence of processes demanded by a customer, a bulk design of a chip, forming required masks, and production of the chip, so that this method merely reduces the amount of design procedures compared with the full custom method. Moreover, since it is necessary to form all masks according an to individual customer's demands, the cost of forming the masks is added to the chip price, and if the number of chips required is small, the proportion of the cost of a mask per chip is increased, and thus the chip cost becomes higher than that produced by the gate array method.

The electrode connections of a common DRAM (dynamic random access memory) are now composed of four layers of polycrystalline silicon film and two layers of aluminum film, and thus the procedure for bulk manufacture of usual storage elements is very long, e.g., from scores of steps to a hundred and scores of steps. Currently, it is difficult to mount such large capacity storage elements on an ASIC, because of the large number of steps required by this procedure.

In the prior art, a divided exposure of a resist layer formed on a semiconductor chip is used when a single exposure operation cannot cover the whole of the chip area to be exposed to an energy ray, due to limitations in the size of the lens used for the exposure. In this case, the individually exposed areas are fully merged at the common boundary line therebetween, to thus form a single area having an intended function as a whole.

By contrast, the chip of the semiconductor device of the present invention is provided with two or more unit circuit-blocks or cells, each having a separate function, which are not interconnected by an underlying layer in which the unit circuit-blocks are present but are connected to each other by interconnections in an overlaying layer formed on the underlying layer. To the applicant's knowledge, semiconductor devices having such a construction have not been disclosed in the prior art.

SUMMARY OF THE INVENTION

Therefore, an object of the invention is to provide a novel method of manufacturing a semiconductor device meeting a specification required by a particular customer, with a reduced delivery time.

Another object of the invention is to provide a method capable of supplying ASIC devices at a lower cost, even if only a small number of such devices are required.

A further object of the invention is to provide a method whereby a memory with a large capacity can be mounted on an ASIC device by a reduced number of production procedures therefor.

These objects are achieved by a method of manufacturing a semiconductor device having two or more unit circuit-blocks, each provided with a separate function and formed on a chip, and interconnections inter-connecting the unit circuit-blocks, the method comprising the steps of, (a) in a chip area on a semiconductor substrate, forming two or more unit circuit-blocks, each provided with a separate function and separated from each other, by a repetition of a process comprising, (i) sequentially exposing each block section within each chip area on the substrate coated with a resist film, using a mask for each block section, thereby to form two or more latent images of the respective block patterns of said block sections within the chip area, (ii) simultaneously developing all of the latent images formed on the substrate, thereby to form a resist pattern, and (iii) using the resist pattern to further process the substrate; and (b) forming external interconnections mutually and externally connecting the unit circuit-blocks on the chip area, using a resist pattern formed on the circuit-blocks by exposing a resist film coated over the substrate and wherein a mask is used for forming the resist pattern, and then developing the pattern.

The present invention also provides a semiconductor device having two or more unit circuit-blocks, each provided with a separate function, formed on a chip, and interconnections mutually connecting the unit circuit-blocks, wherein the unit circuit-blocks are formed on a chip, as a lower layer, between which a separating zone exists that separates the unit circuit-blocks from each other and wherein no interconnections of the separated unit circuit-blocks are included within the lower layer, interconnections mutually connecting the unit circuit-blocks instead being formed in an upper layer situated on the underlying layer.

BRIEF DESCRIPTION OF THE DRAWINGS

The above and other objects and advantages of the present invention will be more fully understood from the following detailed description given with reference to the accompanying drawings, in which.

DESCRIPTION OF THE PREFERRED EMBODIMENTS

A feature of the method of the present invention is that a lower layer comprising two or more unit circuit-blocks, each with a separate function, is first formed in each of plural chip areas on a semiconductor substrate, and interconnections mutually connecting (i.e., interconnecting) the unit circuit-blocks are then formed as an upper layer overlaying the lower layer. Therefore, the lower layer comprises only the unit circuit-blocks and has no interconnections thereof, and the upper layer comprises the only interconnections of the unit circuit-blocks.

The term "unit circuit-blocks" as used herein defines a macro cell formed in a section of a chip and having an individual function separate from those of other unit circuit-block(s) formed on the same chip. It is assumed that, when such as unit circuit-block alone is cut out of a substrate it can be satisfactorily used a a chip having a certain function. The unit circuit-blocks are typically exemplified by gate arrays, such as random logic devices, adders and multipliers, memories such as various random access memories (RAMs) and read-only memories (ROMs), various central processing units (CPUs), analog integrated circuits, such as A/D converters and comparators, and other various ICs and LSIs.

In the present invention, various unit circuit-blocks are made ready for customizing as an ASIC, and, prior to a customer's order, various sets of masks employed in photolithography processes for making each unit circuit-block, as well as various types of photolithography masks for forming a scribing line defining a standardized chip area, are made ready for use.

Figure 1A:
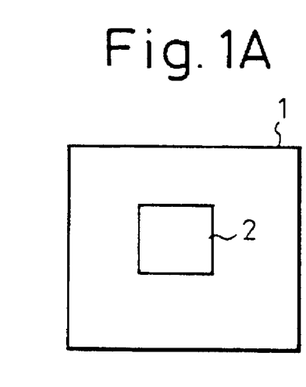
FIGS. 1A to 1C schematically show various masks for making different unit circuit-blocks.
Figure 1B:
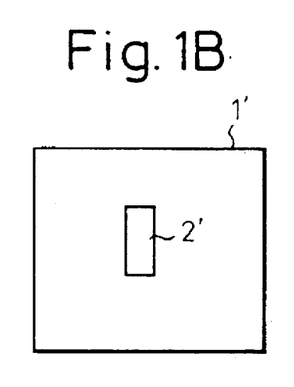
Figure 1C:
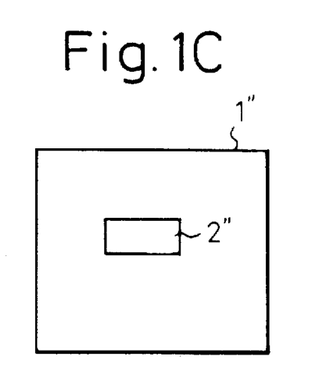

FIGS. 1A to 1C show various prefabricated masks 1, 1', and 1" for making different blocks; a photolithography pattern is formed in the area indicated by 2, 2', and 2". As can be seen, a number of masks are prepared for each unit circuit-block. For example, to make a unit circuit-block occupying a section of a chip, or chip area of a substrate, corresponding to the configuration and dimensions of the rectangle indicated by the numeral 2 in FIG. 1A, the masks used are provided with a respective pattern formed in an area having a size similar to that of the area indicated by the numeral 2, such as for forming a diffusion, an insulating or a conducting layer, or contact holes, in the course of the unit block formation.

Figure 2A:
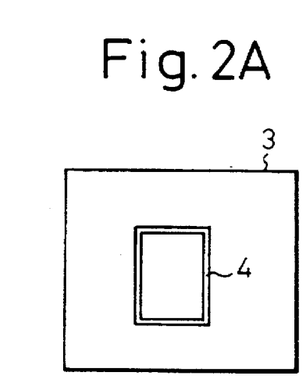
FIGS. 2A to 2C schematically show masks for forming a scribing line for chips of a small, moderate, and large size, respectively.
Figure 2B:
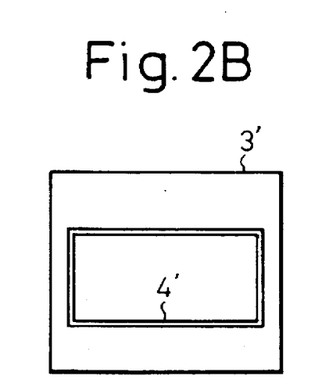
Figure 2C:
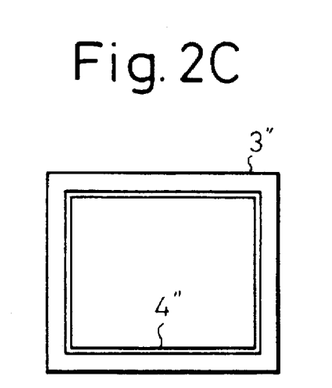

In FIGS. 2A to 2C, masks 3, 3', and 3" for forming a scribing line for chips of small, moderate, and large sizes, respectively, are illustrated. The photolithography patterns of the scribing lines, formed in the masks 3, 3', and 3", are shown by the numerals 4, 4', and 4", respectively.

Figure 3:
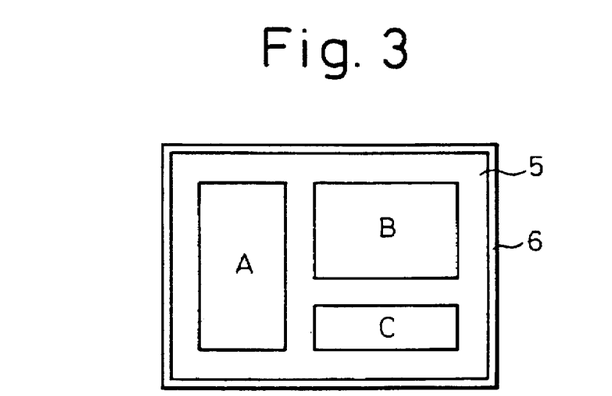
FIG. 3 diagrammatically illustrates block sections of a chip area in which different unit circuit-blocks are formed.

When unit circuit-blocks to be mounted on a chip are specified by a customer, the layout of the circuit-blocks is designed in such a manner that all of the blocks are situated in a chip area of a standardized size, without leaving a surplus space, as illustrated in FIG. 3. In this drawing, the chip area 5 is surrounded by a scribing line area 6, and three circuit-blocks A, B, and C are located within the chip area 5. Based on this circuit-block layout, a wafer process for making elements in bulk (i.e., a process ranging from the initial oxidation of a wafer to the formation of internal interconnections in each circuit-block) is immediately started.

Figure 4A:
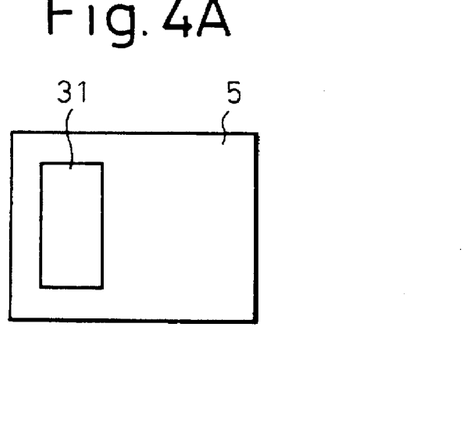
FIGS. 4A to 4F schematically illustrate a process for making unit circuit-blocks in a chip area.
Figure 4B:
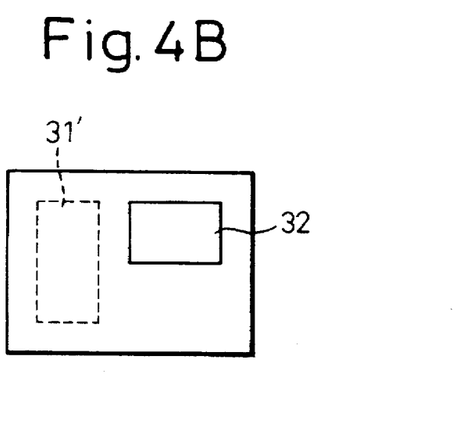
Figure 4C:
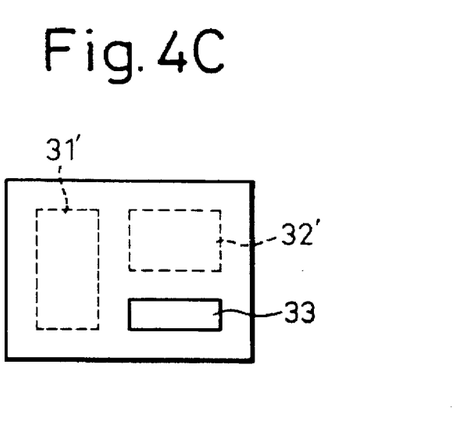
Figure 4D:
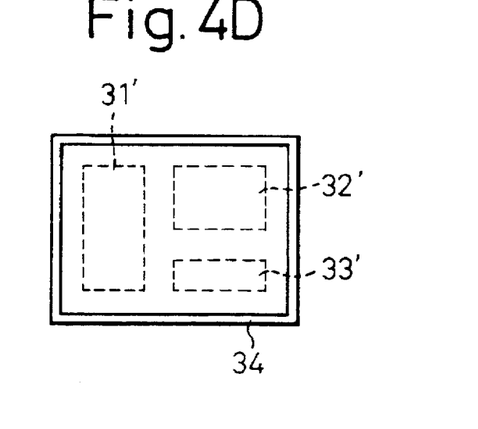

In a photolithography process, a resist film is coated over a wafer and baked, the wafer is alleged to thereby bring a given point within the chip area 5 thereof to the center of a mask for the block A (ct., FIG. 4F), and the section of the chip area not covered by the mask pattern 31 (FIG. 4A) is exposed by an appropriate energy beam, to thereby form the latent image 31' for the block A, as illustrated by the dashed line in FIG. 4B. Subsequently, the section of the chip area for the block B, and then the section for the block C, are exposed in this order, using mask patterns 32 and 33 for respective blocks (FIGS. 4B and 4C), to thus form the latent images 32' and 33' for blocks B and C, as illustrated by the broken lines in FIG. 4C and 4D, in a similar way. Where an additional exposure for the scribing line is required, this is also effected by using a mask pattern 34, as illustrated in FIG. 4D.

Figure 4E:
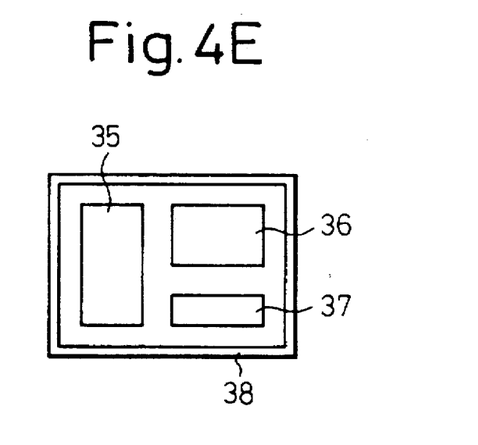

When the exposure of the blocks and, if any, the frame-like zone for the scribing line of all the chip areas in the wafer is completed, all of the latent images are simultaneously developed to thereby form resist patterns 35, 36, 37, 38 for all of the respective blocks and the scribing line, as shown in FIG. 4E. The wafer is then subjected to a subsequent process utilizing the formed resist patterns, such as an etching or ion implantation process, and the resist is then removed from the wafer.

Figure 4F:
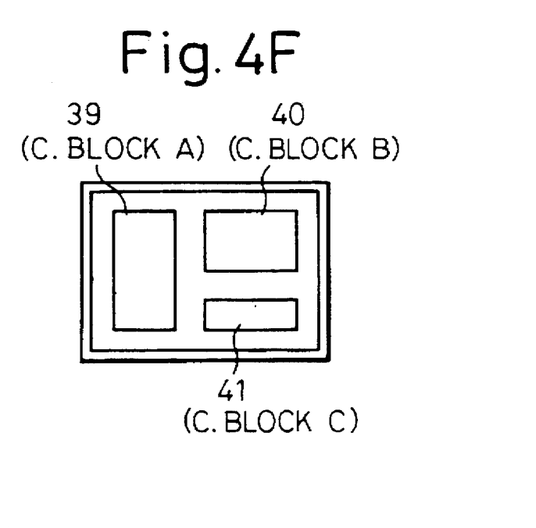

In a similar way, the combination of photolithography and the subsequent processes is repeated for the number of times required for finishing the formation of all of the unit circuit-blocks 39, 40, 41, as shown in FIG. 4F. By this stage, elements formed within the same block section are mutually connected by internal interconnections. The internal interconnections are formed only within the respective, individual block section, so that the zone not occupied by the block sections is free of interconnections.

It should be noted that not all of the blocks are always subjected to all of the photolithography and subsequent processes, since the number of processes required for making a circuit-block, such as etching and film deposition, depends on the type of each specific circuit-block.

In the course of this wafer process, if a pattern design of external interconnections between the circuit-blocks and the making of corresponding masks therefor are carried out, the interconnection pattern design and mask-making are completed by the time the wafer process is sent on to an external interconnection process, thereby making it possible to form the external interconnection.

The forming of the external interconnections is effected by patterning a conductive film deposited over the lower layer of circuit-blocks, as usual, using the mask for making the external interconnections.

Figure 5A:
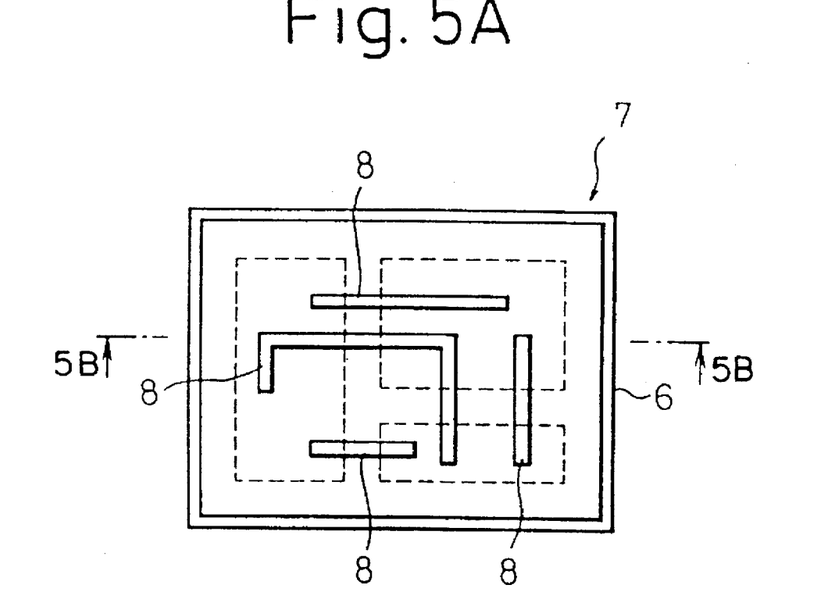
FIG. 5A is a schematic top view of an ASIC chip provided with external interconnections between different circuit-blocks manufactured by the method of the present invention.
Figure 5B:
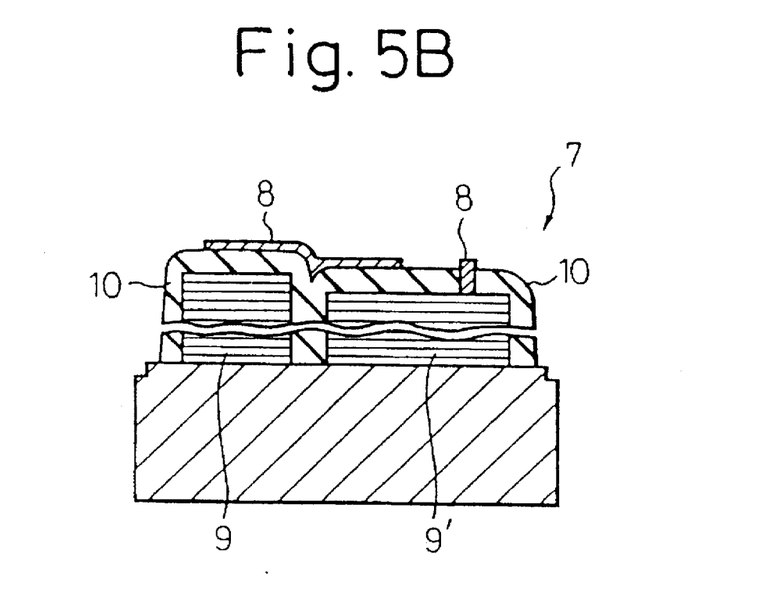
FIG. 5B is schematic view of the chip in FIG. 5A, in a cross section taken along the line 5B—5B in FIG. 5A.

FIG. 5A is a schematic top view of an ASIC chip 7 provided with external interconnections 8 produced by the method of the present invention, and FIG. 5B is a schematic cross section view of the chip in FIG. 5A, taken along the line 5B—5B in FIG. 5A. As shown in FIG. 5B, the circuit-blocks 9, 9' are not interconnected in the lower layer in which they are formed, but are only interconnected in the upper layer, i.e., the external interconnections of the upper layer overlaying the lower layer. The external interconnections 8 are formed on an insulating film 10, over the circuit-blocks 9, 9'. The external interconnections may be formed by one or more layers. In the latter case, the upper layer of the external interconnections is composed of one or more sublayers of interconnections.

As mentioned above, a feature of the ASIC device according to the present invention is that the lower layer of the device formed on a chip provides no interconnections between the circuit-blocks, and the upper layer comprises the only external interconnections, as typically shown in FIG. 5B. Conversely, a semiconductor device according to the standard cell method of the prior art has internal interconnections within a block and external interconnections between different blocks, both of which are formed in the same layer by using a mask containing patterns of both the internal and external interconnections. An example of internal and external interconnections of the same layer is typically shown in FIG. 7 of U.S. Pat. No. 4,701,778, in which cells 1 and 2 represent the circuit-blocks in the present invention, and OTs and BVDD represent the internal and external interconnections, respectively.

Chips mounting circuit-blocks are finally cut out of the wafer, at the scribing line, and the chips then are subjected to fabrication and testing processes, and finally, delivered to a customer in a short delivery time.

Figure 6:
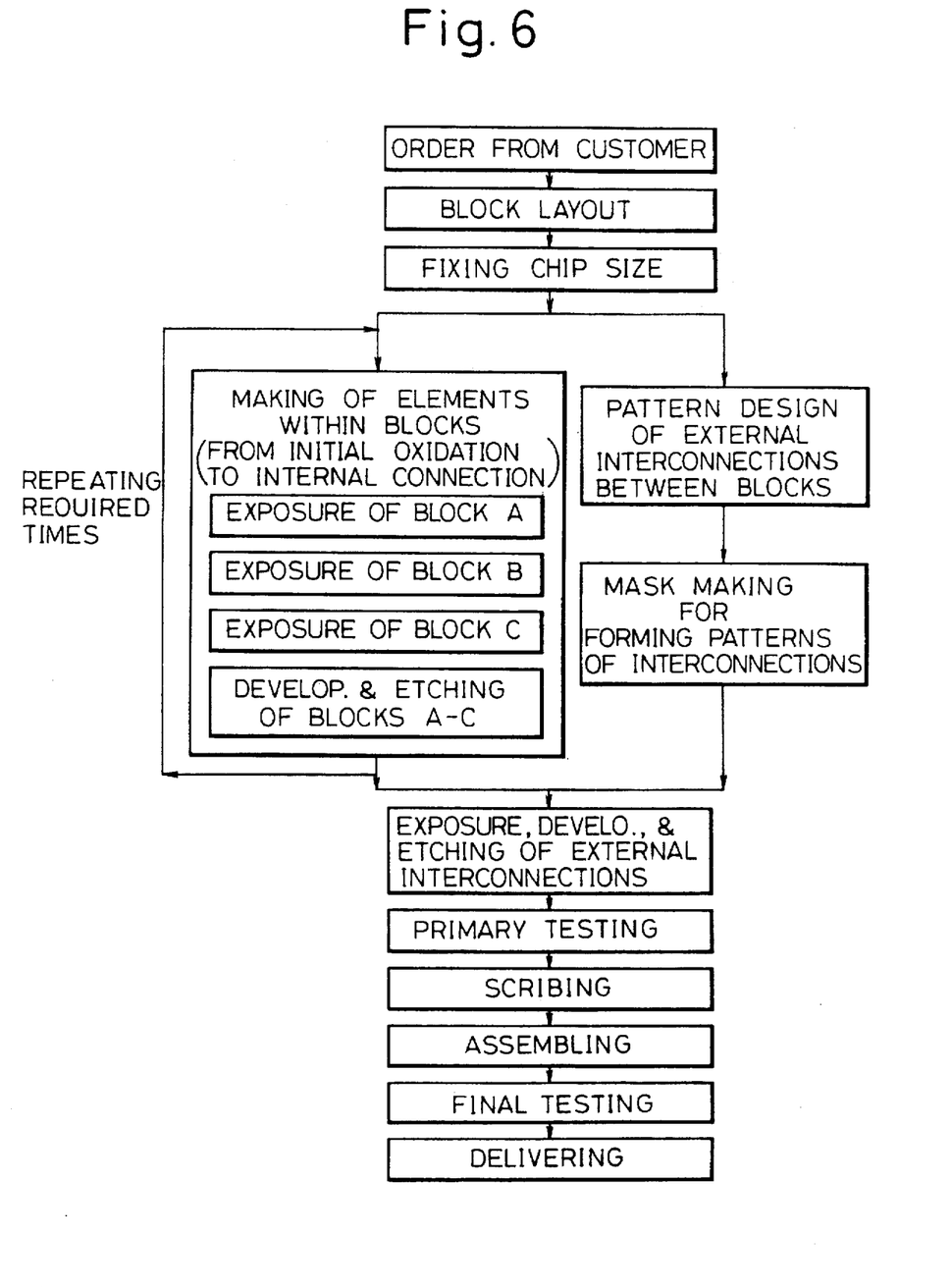
FIG. 6 is a typical flow chart of an example of the method of the invention.

A flow chart of the above method, which is an exemplification of the present invention, is indicated in FIG. 6. As can be seen from the flow chart, according to the invention, the design of external interconnections between the circuit-blocks and the making of a mask therefor are carried out in parallel with the forming of the circuit-blocks. Accordingly, a delivery time in the present method can be reduced to 5 to 6 weeks, in contrast to that of the prior standard cell method of usually 6 to 7 weeks. If an exposure of a scribing line is required, this can be effected before or after the exposure of blocks A to C, and a simultaneous etching of the blocks and the scribing line carried out.

A more specific embodiment of the present invention is provided below, by way of example. The example is for purposes of illustration only and is not to be construed as limiting the spirit and scope of the invention.

First, various masks are prepared having respective patterns each for forming a coupling unit circuit-block such as a selected one of dynamic random access memories (DRAMs), static random access memories (SRAMs) and read-only memories of different capacities and degrees of integration, and logic gates. These unit circuit-blocks are shown to customers.

Figure 7:
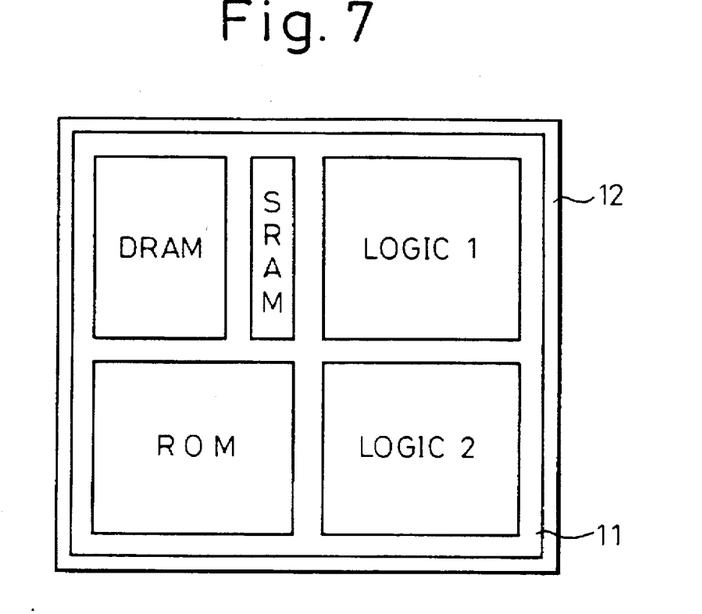
FIG. 7 shows a chip area in which five block sections are fixed.

Assuming that a customer orders an ASIC device having a complexity of elements comprising a 16 Mbit DRAM, 16 Mbit SRAM, 16 Mbit ROM, and two 1 Mgate logics, block patterns of unit circuit-blocks fitting the customer's requirements are selected, a block layout is made, and a size of the chip area 11 is subsequently fixed, taking into account the amount of space to be held as a margin for external connections between different blocks, as shown in FIG. 7. The frame-like area 12 outside the chip area is for a scribing line.

A wafer process involving an initial oxidation of a wafer, and the completion of internal interconnections within each circuit-block is then initiated, using a mask having a pattern for a scribing line that matches the determined chip area and masks having a pattern matching each circuit-block.

Figure 8A:
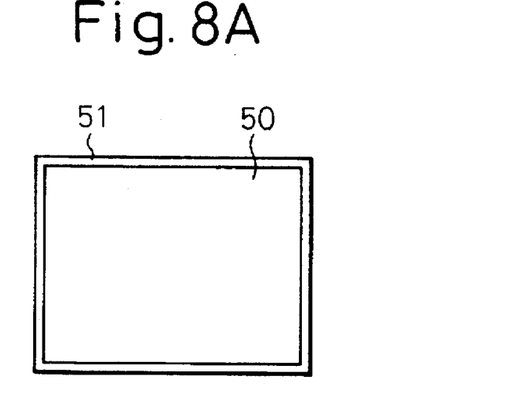
FIGS. 8A to 8F is a schematic diagram showing a process for making unit circuit-blocks as used in an embodiment of the method of the present invention.

In the wafer process, for example, when first forming an activated area within a chip of a silicon wafer, a surface of the wafer is oxidized, a silicon nitride ($Si_3N_4$) film is deposited on the oxidized surface, and a resist film is then coated over the wafer and baked. As shown in FIG. 8A, a scribing line pattern 51 is formed in the margin area of the chip 50 by an exposure of the area using the mask therefor, followed by the development of a latent image and etching. Other possible patterns, such as a pattern for alignment, are also formed in this stage.

Figure 8B:
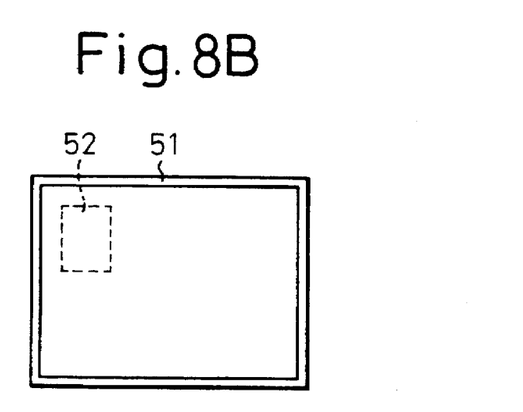
Figure 8C:
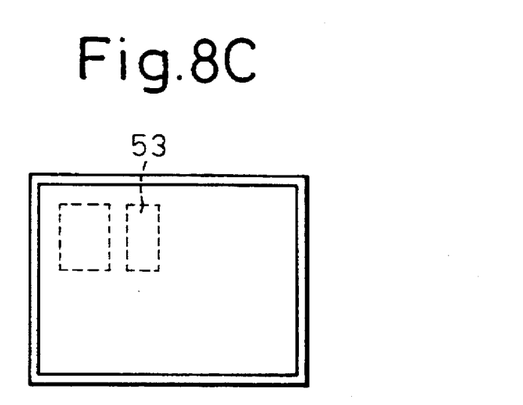
Figure 8D:
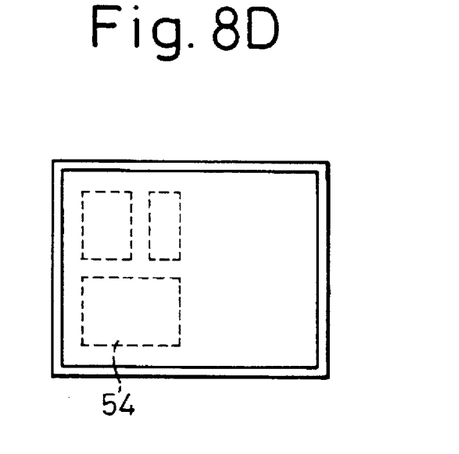
Figure 8E:
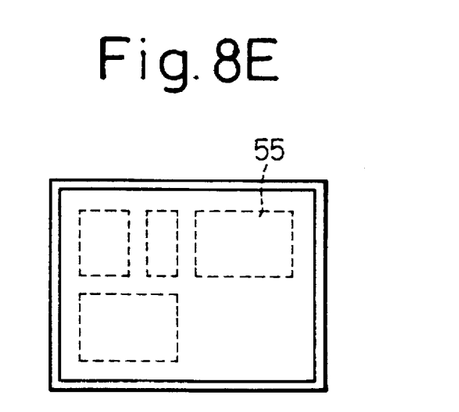
Figure 8F:
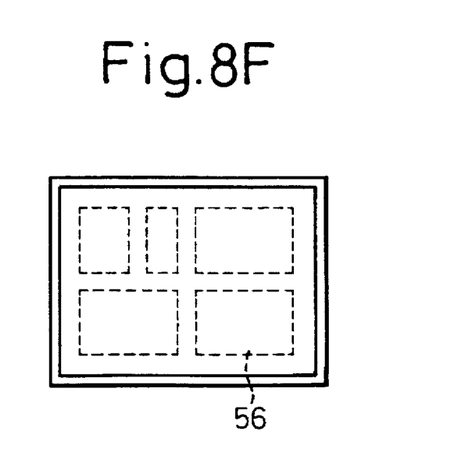

A given section of the chip area is then exposed by detecting the specified place (i.e., location) of a DRAM, by using the alignment pattern and a mask therefor, to thereby form a latent image 52 of the block pattern of the DRAM in the resist film, as shown by a broken line in FIG. 8B. In a similar way, other latent images 53, 54, 55, 56 of the block patterns of SRAM, ROM logic 1 and logic 2 are successively formed inside the scribing line, using respective masks therefor, as illustrated in FIG. 8C to 8F.

A set of latent images 52 to 56 thus formed in the chip area, as well as the other sets of latent images formed in the other chip areas on the same wafer, are then simultaneously developed using a developer, to complete a block pattern of the resist film corresponding to a first sublayer of each unit circuit-block. An activated area pattern of the silicon nitride film is subsequently finished within each block section by etching the uncovered silicon nitride and then removing the remaining resist.

The silicon nitride film left behind is used as a mask for making a field silicon dioxide ($SiO_2$) film by a preferential oxidation process, and then removed.

Following the forming of the field silicon oxide film, a gate $SiO_2$ film is formed by a thermal oxidation process, in a similar manner.

The wafer is further processed in a way similar to the forming of the activated area described above, for example, by depositing a polycrystalline silicon film over the wafer, and patterning the film to form a gate electrode and leads for a transistor. Although, in the early stage of the alignment for the forming of an activated area, only the scribing line has been first exposed, developed and etched due to the need of the formation of the alignment mark before the divided exposure of each circuit block, a scribing line may be formed in any step of a wafer process. Accordingly, when a scribing line is formed in a photolithography step later than a first step, a simultaneous development of the patterns of the scribing line and circuit-blocks may be effected.

By repeating a formation of a necessary pattern by photolithography, and a subsequent process using the formed pattern, until the internal interconnections within each unit circuit-block are completed, a production of bulk chips on which a lower layer comprising necessary unit circuit-blocks is mounted, is finished. At this point, all of the unit circuit-blocks are separate from each other, and no external interconnections exist between the different blocks.

Concurrently with the progress of the wafer processing steps, an external interconnection design for mutually connecting the unit circuit-blocks formed within a chip area is carried out and, according to the design, a mask for making the external interconnections is prepared.

For making external interconnections, a phosphosilicate glass (PSG) film is deposited over the wafer finished the wafer process, contact holes are opened in the PSG film, and a conductive film of aluminum is then deposited by a sputter process. Processes up to the opening of contact holes may be carried out, one by one, for each of the unit circuit-blocks, or together for all of the blocks within the same chip area, as in a subsequent formation of external interconnections with a conductive metal.

Following the opening of contact holes and the deposition of a conductive film of aluminum, an external interconnection pattern for connecting the circuit-blocks to each other in the whole chip area is exposed, developed and etched, and a surface protective insulating film is deposited, to thereby finally finish the ASIC chip. Where the upper layer of external interconnections is composed of more than one sublayer of conductive metal, the processes of opening contact holes and forming the upper sublayer interconnections are further carried out.

Figure 9:
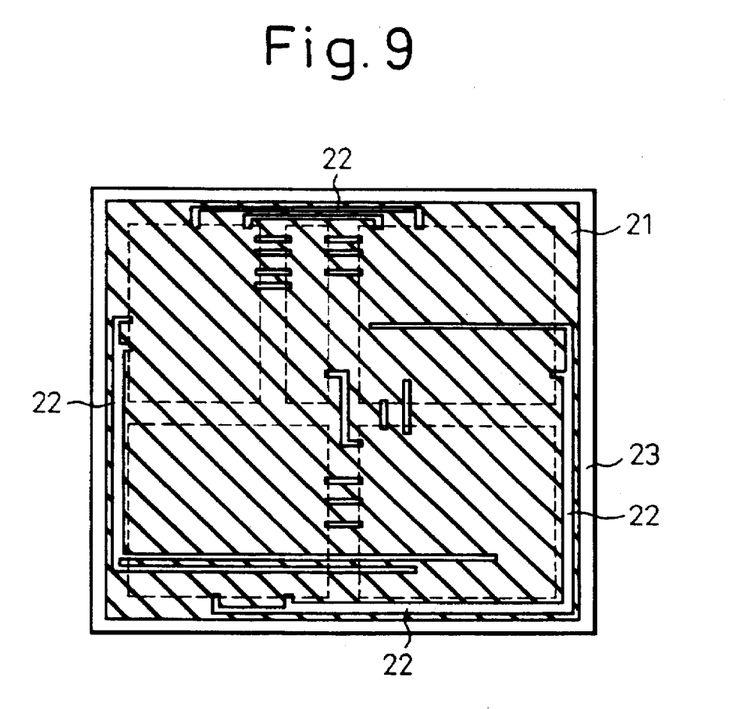
FIG. 9 is a schematic view of external interconnections formed on an ASIC chip according to the invention.

FIG. 9 is a schematic view of external interconnections 22 formed on a PSG insulating film 21 of the ASIC chip manufactured in the above example. In this drawing, unit circuit-blocks formed beneath the insulating film 21 are indicated by broken lines, and a scribing line around the insulating film 21 is shown by the numeral 23.

In FIG. 9, the external interconnections are very roughly shown, for illustration only. In practice, a much higher number of external interconnections is made. Furthermore, the external interconnections are preferably arranged by taking spaces therebetween which represent an integer-folding of a certain unit of space, for a convenient design of external interconnections. On the other hand, internal interconnections appearing in a unit circuit-block existing in the lower layer under the external interconnection layer are generally formed with random spaces.

Memory capacities and logic scales are important factors in an ASIC device design for reducing the waste of unused elements, to satisfy customer's requirements. By forming units, such as those referred to above, as divided blocks and finally interconnecting same, various requirements from customers can be satisfied.

According to the present invention, the production of elements in unit circuit-blocks and the design of an external interconnection pattern are carried out in parallel when an ASIC device is ordered by a customer. Accordingly, the completion of the production of the elements in the blocks can be immediately followed by the external interconnection formation, to thereby allow a faster delivery of the products to the customer. Moreover, the present invention makes it possible to mount, on an ASIC device, a memory using multilayers of polycrystalline silicon films as well as a multilayered and high integrated logic which require a large number of steps for a production thereof. Thus, since the memory capacity is greatly increased by the use of recent advanced memories, and the number of logical gates is also increased, the invention makes a great contribution to an enlargement of the application of ASIC devices.

In addition, the number of masks, for which the customer must pay the expense of fabricating same, are limited and, accordingly, the chip price becomes lower, even when the customer's order is for only a small number of devices, because various masks for making unit circuit-blocks in bulk can be used in common for different customers.

I claim:

1. A method of manufacturing an application specific integrated circuit (ASIC) device on a semiconductor substrate having a resist film coated thereon, comprising:

(a) forming a set of plural unit circuit blocks in mutually spaced relationship on corresponding, mutually spaced block sections of a chip area of the semiconductor substrate having the resist film thereon, each unit circuit-block having a separate, respective function and being physically separated from, and not electrically connected to, each other unit circuit-block of the set, by:

a fabrication process comprising:
   (i) individually and in sequence for the plural unit circuit blocks of the set, selectively exposing each block section within the chip area using a respective, individual mask for each block section, to form plural, respective latent images of the plural unit circuit block patterns in said corresponding block sections of the chip area,
   (ii) simultaneously developing all of the latent images formed on the substrate to form a resist pattern, and
   (iii) using the resist pattern, further processing the substrate and completing formation of the set of plural unit circuit blocks; and (b) forming external interconnections selectively, externally interconnecting the plural unit circuit-blocks of the set formed on the chip area, by:
   (i) forming an interconnection layer on the plural unit circuit-blocks,
   (ii) coating a resist film over the interconnection layer and exposing the interconnection layer, using an interconnection mask, for making a corresponding resist pattern, and
   (iii) developing the corresponding resist pattern to form the external interconnections from the interconnection layer.

2. The method according to claim 1, wherein various sets of masks, used in exposing each block section to make each corresponding unit circuit-block, are prepared for use, prior to defining a set of selected unit circuit blocks for manufacturing a specific ASIC device.

3. The method according to claim 2, wherein various types of masks for forming a scribing line defining a standardized chip area are prepared for use, prior to defining a set of selected unit circuit blocks for manufacturing a specific ASIC device.

4. The method according to claim 1, wherein the unit circuit-blocks are not mutually, externally connected during step (a).

5. The method according to claim 1, wherein the unit circuit-blocks comprise one or more of gate arrays, memories, central processing units, analog integrated circuits, and other ICs and LSIs.

6. The method according to claim 1, wherein internal elements formed within a unit circuit-block are mutually connected by internal interconnections during the step (a).

7. The method according to claim 6, wherein the internal interconnections are made of aluminum or a metal having a higher melting point than aluminum.

8. The method according to claim 1, wherein steps of designing the external interconnections and making the mask used for forming the external interconnections are carried out in parallel with the step (a) of forming the set of plural unit circuit blocks.

9. The method according to claim 1, wherein the interconnection layer which is patterned for forming the external interconnections comprises plural sublayers of interconnections.

10. The method according to claim 9, wherein the external interconnections are formed of aluminum.

11. A method of manufacturing an intermediate production product, used for producing a corresponding customized semiconductor device, the intermediate production product comprising a set of unit circuit-blocks selected from a plurality of unit circuit-blocks having respective, individual functions, each unit circuit-block comprising plural elements internally interconnected therewithin and the corresponding customized semiconductor device further requiring external interconnections between, and selectively interconnecting, the unit circuit blocks of the corresponding intermediate production product, the method comprising the steps of:

(a) providing previously designed, plural masks respectively for forming the plurality of unit circuit blocks;

(b) defining, for the associated set of selected unit circuit blocks, corresponding block sections of a chip in which the selected unit circuit blocks are to be formed;

(c) selecting the respective masks previously designed for forming the selected unit circuit blocks of the set;

(d) individually and in sequence for the plural unit circuit blocks of the set, selectively exposing each block section within the chip area using a respective, individual mask for each block section, thereby to form, individually and in sequence, respective, plural latent images of the unit circuit block patterns in said corresponding block sections of the chip area,; and (e) simultaneously developing the plural latent images to form a resist pattern in a resist layer on the chip and, using the resist pattern, further processing the chip to produce the intermediate production product comprising the selected unit circuit blocks, including the respective, individual elements and the internal interconnections of each thereof, and wherein the selected unit circuit blocks of the associated set have no external interconnections therebetween.

12. A method of manufacturing a customized semiconductor device in accordance with claim 11, further comprising:

(f) using the intermediate production product produced in steps (a) to (e):
  (i) defining a pattern of external interconnections between the unit circuit blocks of the associated set thereof of the intermediate production product, as required for the corresponding customized semiconductor device and in accordance with the block sections of the chip in which the selected unit circuit blocks are to be formed, and
  (ii) preparing an interconnection mask defining the required, selective external interconnections; and (g) following step (e), forming an interconnection layer on the unit circuit blocks and a resist layer on the interconnection layer; and (h) patterning the resist layer using the interconnection mask and using the patterned resist layer to form the selective external interconnections between the unit circuit blocks of the associated set thereof, as required for the customized semiconductor device.

13. A method of manufacturing customized semiconductor devices in accordance with claim 12, wherein the customized semiconductor device comprises application specific integrated circuits (ASICs).

* * * * *

UNITED STATES PATENT AND TRADEMARK OFFICE
CERTIFICATE OF CORRECTION

PATENT NO. : 5,696,013
DATED : Dec. 9, 1997
INVENTOR(S) : EMA

It is certified that error appears in the above-identified patent and that said Letters Patent is hereby corrected as shown below:

TITLE PAGE: [62] Related U.S. Application Data, change "Mar. 12, 1992" to --Mar. 13, 1992--.

Col. 1, line 62, change "an to" to --to an--.

Col. 3, line 51, after "function" insert --,--;
line 52, after "that" delete ",";
line 53, change "such as" to --such a--;
line 54, change "a a" to --as a--.

Signed and Sealed this

Twenty-sixth Day of May, 1998

Attest:

BRUCE LEHMAN

Attesting Officer   Commissioner of Patents and Trademarks